United States Patent [19]

Bortnichuk et al.

[11] 4,082,914

[45] Apr. 4, 1978

[54] METHOD OF STABILIZING ARC VOLTAGE IN PLASMA ARC FURNACE AND APPARATUS FOR EFFECTING SAME

[76] Inventors: Nikolai Iosifovich Bortnichuk, ulitsa Ermolovoi, 17, kv. 23, Moscow; Valery Pavlovich Davydov, ulitsa Mayakovskogo, 18A, kv. 7, Elektrougli Moskovskoi oblasti; Mikhail Mironovich Krutyansky, Leninsky prospekt, 91, kv. 412, Moscow; Vladimir Sergeevich Malinovsky, prospekt Mira, 14, kv. 24, Khimki Moskovskoi oblasti; Vladimir Alexeevich Khotin, Zelenodolskaya ulitsa, 14, korpus 2, kv. 65, Moscow, all of U.S.S.R.

[21] Appl. No.: 688,941

[22] Filed: May 21, 1976

Related U.S. Application Data

[63] Continuation-in-part of Ser. No. 468,546, May 9, 1974, abandoned.

[30] Foreign Application Priority Data

May 14, 1973 U.S.S.R. .............................. 1914193

[51] Int. Cl.[2] ........................ H05H 1/24; H01J 37/305

[52] U.S. Cl. ........................................................ 13/2 P

[58] Field of Search ..................... 13/2, 2 P, 9, 31, 34; 219/121 P

[56] References Cited

U.S. PATENT DOCUMENTS

| | | | |
|---|---|---|---|
| 2,862,099 | 11/1958 | Gage | 13/9 P |
| 3,546,347 | 12/1970 | Hausig | 13/9 P |
| 3,771,585 | 11/1973 | Ulrich | 13/9 P |

*Primary Examiner*—R. N. Envall, Jr.

*Attorney, Agent, or Firm*—Haseltine, Lake & Waters

[57] ABSTRACT

A method and apparatus wherein a plasma arc column is embraced by a gas flow along its entire length, within a furnace melting chamber, for being cooled and constricted. The gas drawn off the melting chamber, cleaned and cooled, may be used for this purpose. The apparatus is provided with a closed circuit including a heat exchanger, a dust collector, a gas flow controller and a gas blower. The circuit is used for drawing off the gas from the melting furnace and supplying it into an annular space between the nozzle of the plasma generating means and the outer housing.

5 Claims, 2 Drawing Figures

Figure 1:
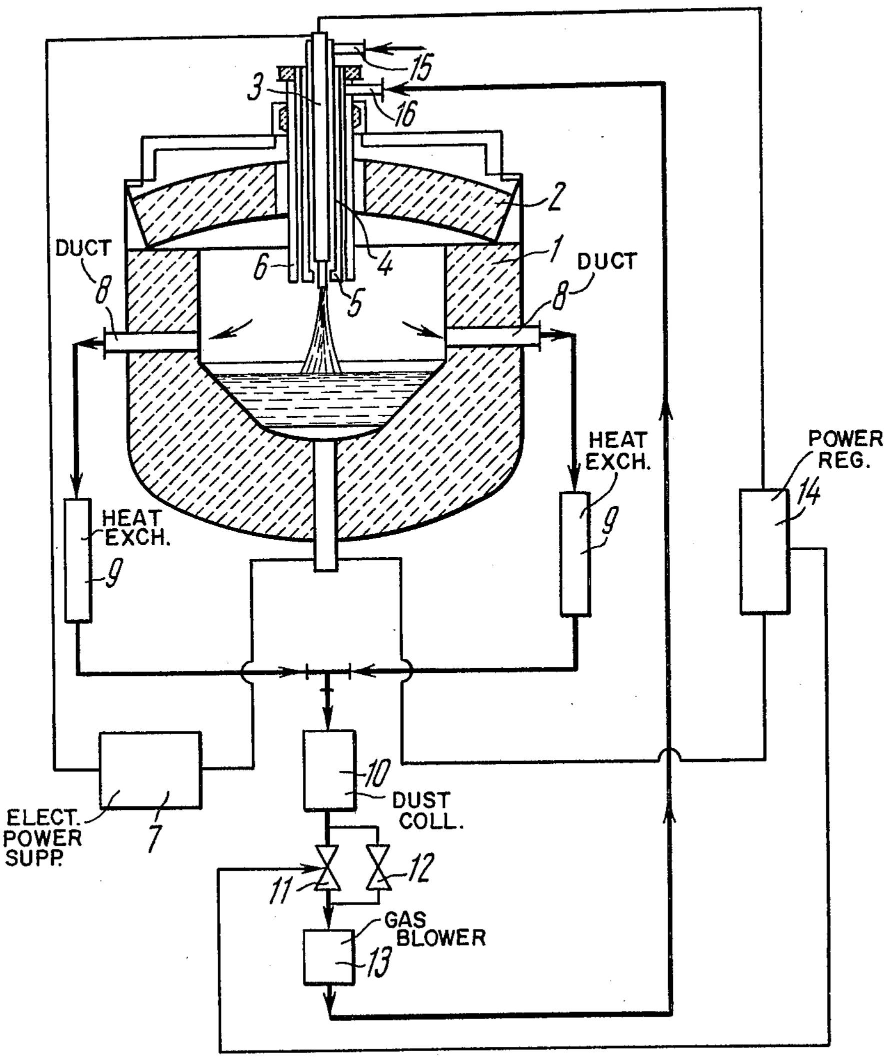

METHOD OF STABILIZING ARC VOLTAGE IN PLASMA ARC FURNACE AND APPARATUS FOR EFFECTING SAME

This is a continuation-in-part of applicants' parent application Ser. No. 468,546, filed May 9, 1974, titled "Method of Stabilizing Arc Voltage in Plasma Arc Furnace and Apparatus for Effecting Same", now abandoned.

The present invention relates to electrothermal equipment utilizing plasma heating techniques, and more particularly to a method of stabillizing arc voltage in a plasma arc furnace and an apparatus for effecting same.

It has been previously proposed to stablize and regulate the electric arc column voltage of a plasma generator in a plasma melting furnace by varying the plasma forming gas composition. In accordance with this prior art method, a predetermined amount of a high-enthalpy diatomic gas (e.g. hydrogen or nitrogen) is added to the main plasma forming gas, i.e. argon. The mixing valves are made responsive to the voltage-sensitive elements of the furnace voltage regulator, and as the furnace is heated and the arc voltage drops as a result, the proportion of the additional gas (hydrogen or nitrogen) admixed into the argon is automatically increased, causing a rise in the arc voltage.

A disadvantage of this prior art method resides in that hydrogen and nitrogen adversely affect a number of steels and alloys, and in some cases their addition cannot be tolerated.

A widely known prior art plasma arc installation comprises a furnace having a melting chamber charged with the metal to be melted, at least one plasma generating means having an outer housing, an electrode, a nozzle and means for supplying a plasma forming gas into the space between the electrode and the nozzle, whereby a plasma arc column is obtained between this electrode and the metal being melted. The plasma generating means has an electric power supply and a plasma arc power regulator connected to the electrode thereof.

In this installation, a small amount of the plasma forming argon gas is fed between the nozzle and the outer housing of the plasma generating means via a gas supply branch pipe, in addition to the main gas flow, in order to improve the insulation between the housing and the furnace body and to minimize the possibility of an electric breakdown therebetween as well as to prevent spurious arcing. This installation is disadvantageous in that the arc voltage depends on the melting chamber temperature, i.e. the voltage drastically drops as the temperature rises. This leads to a considerable reduction in the output capacity of the furnace during the initial heat-up period while the metal is being gradually melted down (for example, during the first 30 minutes the melting furnace output may fall down from 5 tons to 2.5 tons).

It is an object of the present invention to provide a method of stabilizing arc voltage in a plasma arc furnace allows for a substantial increase in the furnace capacity and a reduction of the metal melting time.

Another object of the present invention is to provide a method of stabilizing the arc voltage, which improves the furnace capacity factor and ensures its operation under preset conditions.

Still another object of the present invention is to provide a plasma arc apparatus wherein the arc voltage of the plasma generating means is stabilized.

Yet another object of the present invention is to provide a plasma arc apparatus whose melting rate and efficiency are improved without rendering the apparatus more complicated in comparison with those of the prior art.

According to the invention, these and other objects are attained in a method of stabilizing the arc voltage in a plasma arc furnace, in the melting chamber whereof a plasma arc column is maintained that extends through the gaseous atmosphere of the melting chamber from the plasma generating means electrode towards the metal being melted, which method comprises supplying gas which is identical in composition with the gas filling the furnace melting chamber, but much cooler than the latter, into the melting chamber in an amount at least 10 times higher than the flow rate of the protective gas and embracing said plasma arc columns along its entire length by the flow of the supplied gas, whereby the peripheral region of the arc column is cooled down, the arc column is constricted and the arc voltage is increased.

The method of the present invention advantageously allows the arc voltage, hence the arc power, to be maintained at a preset level regardless of the melting chamber temperature and melting period, the arc current and length being constant, whereby the metal melting time is reduced, and the furnace output capacity and capacity factor are significantly improved.

According to another feature of the invention, the method contemplates drawing off gas outside the melting chamber, cooling the drawn-off gas, and feeding it into the furnace melting chamber wherein it is used as the afore-mentioned gas flow for embracing the plasma arc column.

The above optional feature of the method of the present invention furthermore avoids extra gas consumption that would be required for cooling down the arc, and ensures an invariable atmosphere within the melting chamber.

According to the invention, a plasma arc apparatus is also provided that comprises a furnace having at least one plasma generating means with a means for supplying a plasma forming gas between an electrode and a nozzle of the plasma generating means, an annular space between the nozzle and an outer housing of the plasma generating means, an electric power supply and a plasma arc power regulator.

The apparatus is characterized in that at least one duct is provided, extending outwards from the melting chamber, the duct having a heat exchanger, a dust collector, a gas flow controller and a gas blower successively arranged therein and being connected to the annular space for feeding the gas to the plasma arc, which gas has been drawn from the melting chamber and processed.

The apparatus according to the invention provides for cutting down the melting time, increasing the furnace output capacity, and improving the capacity factor for a given output capacity rating, while the plasma forming gas composition and flow rate remain unchanged.

Moreover, according to the present invention, the apparatus is further characterized in that the afore-said gas flow controller is responsive to the power regulator output.

In such an embodiment of the apparatus of the invention the arc voltage may be maintained at a preset level or changed at various stages of the melting according to a predetermined program.

Furthermore, in accordance with the invention, the apparatus is characterized in that a valve is arranged in parallel with the gas flow controller for blocking the gas flow controller and cutting off the power regulator.

Such arrangement of the apparatus of the present invention affords the convenience of changeover from automatic to manual power control and vice versa.

Figure 2:
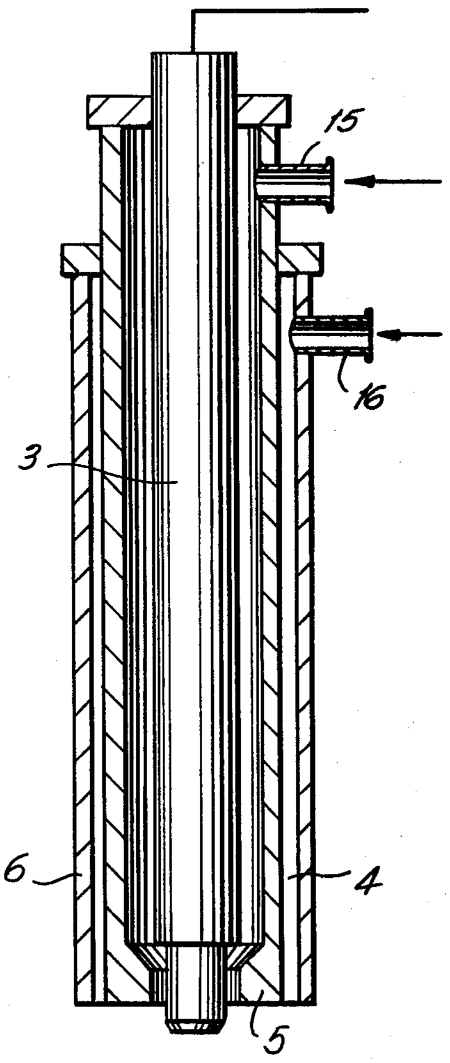

A fuller understanding of the nature, objects and advantages of the invention will be had from the following description of an exemplary embodiment thereof taken in conjunction with the accompanying drawing wherein FIG. 1 s a schematical view of a plasma arc apparatus and FIG. 2 is a cross-section of the plasma torch of FIG. 1.

The apparatus according to the invention comprises a furnace having a lined body 1 and a roof 2 and including at least one plasma generator 3 having an annular space 4 between a nozzle 5 and an outer housing 6 thereof. The furnace is equipped with an electric power supply 7, gas ducts 8, a heat exchanger 9, a dust collector 10, a gas flow controller 11, a gas valve 12, a gas blower 13 and a power regulator 14. The plasma generator 3 has an assembly 15 for feeding gas from a source of gas supply (not shown), which may be a conventional gas main, into the space between the electrode of plasma generator 3 and nozzle 5, and a branch pipe 16 for supplying gas between the nozzle 5 and outer housing 6. The branch pipe 16 leads to and is associated with a pressure outlet of the gas blower 13. The power regulator 14 is associated with the gas flow controller 11.

In the apparatus described above, heating of the gas embracing the plasma arc within the melting chamber is prevented by forcing techniques. The continuously operating gas blower 13 draws the gas from the furnace melting chamber through the gas ducts 8 and supplies it, through a closed-cycle loop including heat exchanger 9, dust collector 10 and gas flow controller 11 into the branch pipe 16 of the plasma generator 3. The power regulator 14, continuously stabilizes, via the flow controller 11, the arc voltage at a preset level. "Spurious" arcing may be checked by opening the normally closed valve 12 and thus causing a sharp increase in the gas supply to the plasma generator branch pipe 16.

What is claimed is:

1. A method of stabilizing and increasing the arc voltage in a plasma-arc metal furnace, the latter including at least one plasmatron with a plasma-generating electrode; the method comrising the steps of maintaining a gas atmosphere and a plasma-arc column in a melting chamber, the arc column extending through the gas atmosphere between the electrode and the metal being melted, and serving to protect the electrode; preventing overheating of the gas atmosphere that surrounds the plasma-arc column by forcing techniques; supplying further quantities of gas to the chamber, identical in composition with the gas atmosphere maintained in the chamber but much cooler than the same, in an amount at least ten times higher than the flow rate of the protective gas; maintaining the arc column along the entire length of the plasma arc by the resulting overflow of the supplied further cooler gas; subsequently embracing the plasmatron as well as the plasma-arc column by the flow of the further, cooler gas; thus cooling down a peripheral region of the arc column with an intensive flow of the cooler gas that coats the arc; constricting the arc column; and thereby increasing the arc voltage.

2. The method as defined in claim 1, further comprising the step of drawing off the further gas from the gas atmosphere contained in the melting chamber; cooling down the drawn-off gas; and feeding the cooled gas into the chamber in said step of supplying the further, cooler gas thereto, for said subsequent embracing step.

3. A plasma-arc apparatus comprising a furnace; at least one plasmatron within said furnace and including a housing, an axially extending electrode and a nozzle located within said housing; means for supplying a plasma-arc generating gas between said electrode and said nozzle; an annular passage between said nozzle and said housing; at least one duct connected to said furnace for the withdrawal of the furnace gas therefrom; a heat exchanger connected to said duct for cooling the withdrawn gas; conduit means connecting said heat exchanger with said annular passage; and means for withdrawing the furnace gas through said duct and said heat exchanger to and through said annular passage, to thereby cool a peripheral area of said plasmatron and enable the maintenance of an increased plasma-arc voltage.

4. The plasma-arc apparatus as defined in claim 3, further comprising means for purifying the withdrawn gas, and for controlling the rate of flow of the same to said annular passage, said withdrawing means including blower means.

5. The plasma-arc apparatus as defined in claim 4, further comprising a valve connected in parallel with said purifying and flow-rate controlling means, further to regulate the amount of gas withdrawn from said furnace.

* * * * *